United States Patent [19]

Hebard

[11] Patent Number: 4,966,885
[45] Date of Patent: Oct. 30, 1990

[54] METHOD OF PRODUCING A DEVICE COMPRISING A METAL OXIDE SUPERCONDUCTOR LAYER

[75] Inventor: Arthur F. Hebard, Bernardsville, N.J.
[73] Assignee: AT&T Bell Laboratories, Murray Hill, N.J.
[21] Appl. No.: 398,797
[22] Filed: Aug. 25, 1989
[51] Int. Cl.[5] .......................... H01L 39/12; B05D 5/12
[52] U.S. Cl. ........................................ 505/1; 505/702; 505/703; 505/728; 505/730; 427/62; 427/63; 156/643
[58] Field of Search .................. 427/38, 62, 63; 505/1, 505/702, 703, 728, 730; 156/643

[56] References Cited

U.S. PATENT DOCUMENTS 4,751,563 6/1988 Laibowitz et al. .

FOREIGN PATENT DOCUMENTS 61-227183 10/1986 Japan .
61-289635 12/1986 Japan .
62-234329 10/1987 Japan .
63-199880 8/1988 Japan .
63-300537 12/1988 Japan .
63-300538 12/1988 Japan .

OTHER PUBLICATIONS

X.X.Xi, J. Geerk, G. Linker, Q. Li and O. Meyer, "Preparation and Superconducting Properties of Ultrathin $YBa_2Cu_3O_{7-x}$ Films", *Appl. Phys. Lett.*, vol. 54, No. 23, pp. 2367–2369, 1989.
Y. Katoh, M. Asahi, H. Asano and O. Michikami, "Preparation of YBaCuO Thin Film dc SQUID", *Japanese J. of Appl. Physics*, vol. 27, No. 6, pp. L110–L1112, 1988.
H. Tsuge, S. Matsui, N. Matsukura, Y. Kojima and Y. Wada, "Superconducting Lines Fabricated from Epitaxial Y–Ba–Cu–O Films", *Japanese J. of Appl. Physics*, vol. 27, No. 11, 1988, pp. L2237–L2239.
D. Dijkkamp, T. Venkatesan, X. D. Wu, S. A. Shaheen, N. Jisrawi, Y. H. Min-Lee, W. L. McLean and M. Croft, "Preparation of Y–Ba–Cu Oxide Superconductor Thin Films Using Pulsed Laser Evaporation from High $T_c$ Bulk Material", Appl. Phys. Lett., vol. 51, No. 8, pp. 619–621, 1987.
B. Oh, M. Naito, S. Arnason, P. Rosenthal, R. Barton, M. R. Beasley, T. H. Geballe, R. H. Hammond and A. Kapitulnik, "Critical Current Densities and Transport in Superconducting $YBa_2Cu_3O_{7-x}$ Films Made by Electron Beam Coevaporation", *Appl. Phys. Lett.*, vol. 51, No. 11, pp. 852–854, 1987.
P. M. Mankiewich, J. H. Scofield, W. J. Skocpol, R. E. Howard, A. H. Dayem and E. Good, "Reproducible Technique for Fabrication of Thin Films of High Transistion Temperature Superconductors", *Appl. Phys. Lett.*, vol. 51, No. 21, pp. 1753–1755, 1987.
L. F. Johnson, "Ion Microstructure Fabrication in Optical, Magnetic and Surface Acoustical Technologies", *Ion Bombardment Modification of Surfaces: Fundamentals and Applications*, Chapter 9, Elsevier, Amsterdam, pp. 361–397, 1984.
Y. Nishi, S. Moriya, N. Inoue, S. Tokunaga, T. Shima, "Rapid Rate of Ion Milling for the High $T_c YBa_2Cu_3O_{7-x}$ System", *J. of Materials Science Letters*, vol. 7, pp. 281–282, 1988.
G. C. Hilton, E. B. Harris and D. J. Van Harlingen, "Growth, Patterning, and Weak-Link Fabrication of Superconducting $YBa_2Cu_3O_{7-x}$ Thin Films", *Appl. Phys. Lett.*, vol. 53, No. 12, pp. 1107–1109, 1988.
Koch et al, *Extended Abstracts–High Temperature Superconductors*, Apr. 1987, pp. 81–84.

*Primary Examiner*—Norman Morgenstern
*Assistant Examiner*—Margaret Bueker
*Attorney, Agent, or Firm*—Martin I. Finston

[57] ABSTRACT

A method for fabricating thin smooth films of a planar metal oxide superconductor is disclosed. Fabrication of the superconductor film comprises depositing, on a substrate, a film of the planar metal oxide superconductor having a thickness greater than desired, and thinning at least a portion of the superconductor film to the desired thickness. In a particular embodiment of the method, thinning comprises exposing the superconductor film to a low energy ion beam directed at grazing incidence to the superconductor surface. Thin superconductor films fabricated in accordance with this method typically have substantially smooth surfaces and can have relatively low RF loss. These films can be advantageously used, inter alia, in RF striplines, microwave cavities and waveguides, bolometers, SQUIDs, and other Josephson junction devices.

7 Claims, 2 Drawing Sheets

METHOD OF PRODUCING A DEVICE COMPRISING A METAL OXIDE SUPERCONDUCTOR LAYER

TECHNICAL FIELD

This invention relates to metal oxide superconductors, and, more particularly, to methods for the fabrication of thin films of metal oxide superconductors, and to articles comprising a film produced by the method.

BACKGROUND OF THE INVENTION

Thin films of high transition temperature (high $T_c$) superconductors are becoming increasingly important in the study of basic superconducting properties, and have significant potential for application to electronic devices. For example, thin films of c-axis oriented Y-Ba-Cu-O consisting of only a few unit cells in one dimension make it possible to study the influence of a limited number of Cu-O planes on its superconducting properties. See, for instance, X.X.Xi et al., *Applied Physics Letters*, Vol. 54, No. 23, pp. 2367–2369, 1989. Since thin metal oxide films can be fabricated that have high transition temperatures similar to those of bulk structures, the use of these films in bolometers and other sensors, SQUIDS, RF striplines, superconducting FETs, and interconnect technology is possible. See, for instance, Y. Katoh et al., *Japanese Journal of Applied Physics*, Vol. 27, No. 6, pp. L1110–L1112, 1988. However, to achieve these applications, it is necessary to develop appropriate microfabrication techniques.

Thin superconducting Y-Ba-Cu-O films have been fabricated by a variety of techniques, including magnetron sputtering (see, for instance, H. Tsuge et al., *Japanese Journal of Applied Physics*, Vol. 27, No. 11, pp. L2237–L2239, 1988), laser evaporation (see, for instance, D. Dijkkamp et al., *Applied Physics Letters*, Vol. 51, No. 8, pp. 619–621, 1987) and e-beam evaporation (see, for instance, B. Oh et al., *Applied Physics Letters*, Vol. 51, No. 11, pp. 852–854, 1987). A stoichiometric form of Y-Ba-Cu-O commonly fabricated is $YBa_2Cu_3O_7$.

Superconducting $YBa_2Cu_3O_7$ is a metal oxide which can be visualized as having layers and chains of copper and oxygen. The layered structure has parallel planes of Cu-O sheets. The Cu-O planes are perpendicular to the c-axis, the c-axis being defined as the crystal axis normal to the basal plane of the unit cell. A compound that can be described as comprising parallel planes of its constituent elements layered one plane on top of another plane is said to have a planar structure.

A thin film with a c-axis orientation has its surface perpendicular to the c-axis of the material, i.e., its surface is parallel to the basal plane of the material. Similarly, a thin film with an a-axis (b-axis) orientation has its surface parallel to the c-axis with the a-axis (b-axis) perpendicular to the surface. For optimal charge transport in the plane of a superconducting film, c-axis orientation is the preferred orientation (see, for instance, P. M. Mankiewich et al., *Applied Physics Letter*, Vol. 51, No. 21, pp. 1753–1755, 1987).

As a layer of c-axis oriented superconducting metal oxide, such as $YBa_2Cu_3O_7$ is deposited on a substrate, the oxide changes with increasing thickness from a substantially 100% c-axis oriented material to a mixture of c-axis and a-axis oriented material. This causes the film surface to become disordered due to the orthogonality of the Cu-O sheets between the two orientations, and to the random distribution of the orientations across the film surface. A disordered surface typically tends to be rough and uneven. In addition, disorder due to a misorientation can result in a surface being structurally of relatively low crystalline quality (see, for instance, X.X.Xi et al., op. cit.).

A rough and uneven surface makes device processing difficult, since device processing typically involves deposition of a layer (layers) of material on the surface. A rough surface also results in a superconductor film having a relatively high RF loss. In addition, a rough junction interface inhibits proper operation of a superconducting tunneling junction. Film deposition at lower processing temperatures helps to reduce, but does not eliminate, the problem.

In view of the need for smooth, thin high $T_c$ superconductor films for device applications, a method for fabricating thin films of metal oxide superconductors of a desired thickness and having a smooth surface would be highly desirable. This application discloses such a method.

DEFINITIONS

The electrical thickness of a film is herein defined as $\sigma_\Box \rho$, where $\sigma_\Box$ is the film sheet conductance, and $\rho$ is the film resistivity. It will be appreciated that electrical thickness, so defined, does not include a possible "dead" stratum of material within, on top, or on bottom of a film which does not contribute to its conductivity. In addition, the use of the sheet conductance as a direct measure of the thickness presupposes that the resistivity is independent of thickness. This is generally the case in c-axis oriented layers of the planar high $T_c$ superconductors of interest herein.

Crystal quality, i.e. the degree of perfection of the crystal structure of a material, is quantified herein by the Rutherford backscattering spectroscopy (RBS) yield ratio, $\chi_{min}$. This parameter is defined as the ratio of the backscattering yield for a "channeling" direction to that for a random direction, as is well known to those skilled in the art. Generally, $\chi_{min}$ is given as a percentage between about 3% and 100%. The lower the value of $\chi_{min}$, the higher is the crystalline quality of the material.

SUMMARY OF THE INVENTION

The inventive method for producing an article comprising a thin film of a planar metal oxide superconductor (e.g. $YBa_2Cu_3O_7$) involves forming a superconductor film having an initial electrical thickness, D, on a substrate and thinning at least a portion of the superconductive film to a desired electrical thickness, d, with $d < D$. Subsequently, the production of the article is completed.

In a particular embodiment, thinning comprises exposing at least a portion of the superconductor film to an ion beam, with the ion energy being in the range 50 eV to 1000 eV. The ions are chosen from the group of elements consisting of $O_2$, Xe, Ar, He, Ne, and Kr. Associated with the ion beam is a beam direction. The beam direction forms an angle of incidence in the range 5° to 20° with the layer surface.

An important advantage of this particular embodiment is that, contrary to expectations, the crystal quality of the film, typically, is not significantly degraded by the ion beam, but can even be substantially improved thereby. The resulting superconductive film typically still possesses relatively high $T_c$, even after prolonged exposure to the ion beam.

Advantageously, thinning according to this particular embodiment can efficiently remove mis-oriented portions of a film, leaving essentially only c-oriented material having a smooth surface. After removal of the mis-oriented portion of a thin film, the thickness to resistivity ratio of the film typically is substantially linear in thinning time, allowing for accurate control of the electrical thickness of the film. Thus, the inventive method makes possible the manufacture of thin oxide superconductor films of uniform, closely controlled thickness. The films typically have a smooth surface that lends itself to further processing and can have a low RF resistance.

DETAILED DESCRIPTION

Figure 1:
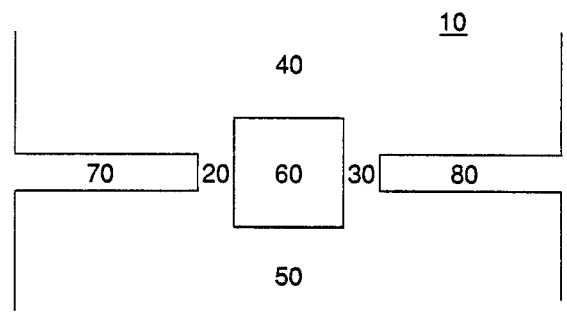
FIG. 1 schematically depicts a SQUID according to the inventive method.

The novel use of ion beams to produce thin films of planar superconductors that have a smooth surface and uniform thickness makes possible the application of these thin films to a variety of devices including microwave cavities and waveguides, bolometers, SQUIDS, and other Josephson junction devices. FIG. 1 schematically depicts an exemplary device, namely, a weak link dc SQUID, 10, which can advantageously be produced according to the inventive method. Portions 20 and 30 are "weak links" connecting the superconducting regions 40 and 50. Portions 60, 70, and 80 are insulating regions defining a superconducting loop. The "weak links", 20 and 30, are thin smooth films of a planar superconductor fabricated according to the inventive method.

The inventive method is most advantageously practiced with a planar metal oxide superconductor. In a first embodiment of the invention, the superconductor is a c-axis oriented metal oxide. Exemplarily, a layer of c-axis oriented $YBa_2Cu_3O_x$, with x about 7, is provided on a $SrTiO_3$ substrate. The superconducting layer can be grown on any appropriate substrate using any of a variety of known techniques which include evaporation, sputtering, and laser evaporation.

At least a portion of the superconducting layer is thinned by exposing the layer to an ion beam. During thinning of the superconducting layer, the substrate with the layer thereon advantageously is rotated about an axis normal to the film surface, such rotation typically resulting in improved uniformity of film thickness. The rotation rate typically is not critical. A rate in the range 0.1 to 20 Hz will generally be satisfactory.

To avoid damage or ion implantation, it is advantageous to use low energy ions, preferably in the range 50 eV to 1000 eV. Below 50 eV there is the possibility that ions will stick to the surface, substantially without removing surface atoms, while above 1000 eV ion damage and implantation typically becomes significant.

The ions are chosen from a group of elements consisting of oxygen and those elements that are chemically non-reactive with the superconductor. As is known, the removal rate of surface atoms is directly dependent, among other factors, on the atomic mass of the ions. As a result, in a first embodiment, xenon ions are used since xenon is a heavy inert gas. Other non-reacting gases that can be used as ions include Ar, He, Ne, and Kr. Though oxygen is reactive, it can still be used in the thinning process. Typically, metal oxide superconducting films are oxygen deficient at the surface, and can become more oxygen deficient as result of preferential sputtering. Thus, a small amount of oxygen implantation into the near-surface region of the film may actually improve the superconducting properties of the metal oxide layer.

Significantly, in accordance with the inventive method, the direction of the ion beam forms a grazing angle of incidence in the range 5° to 20° with the layer surface. For angles less than about 5° the possibility of ion reflection from the surface, without removal of surface atoms, becomes significant, while for angles greater than about 20° surface damage and ion implantation typically become significant.

Though ion beams at grazing incidence angles have been used in some ion milling applications (see, for instance, "Ion Beam Microstructure Fabrication in Optical, Magnetic and Surface Acoustical Technologies," L. F. Johnson, in *Ion Bombardment Modification of Surfaces: Fundamentals and Applications*, Chapter 9, Elsevier, Amsterdam, 1984, incorporated herein by reference, and U.S. Pat. No. 4,751,563), such beams have not been used for thinning and polishing of high $T_c$ superconductor films. However, ion milling of $YBa_2O_3O_{7-x}$ system (see Y. Nishi et al., *Journal of Materials Science Letters*, Vol. 7, pp. 281-282, 1988). In addition, a study has been made on the conductance properties of a microbridge patterned in a thin film of $YBa_2Cu_3O_7$ in which the thickness of the microbridge has been reduced by ion milling at normal incidence (see G. C. Hilton et al., *Applied Physics Letters*, Vol. 53, No. 12, pp. 1107-1109, 1988). In their study, Hilton et al. milled a microbridge, recording I-V characteristics at various stages of ion milling until milling through the microbridge, creating an open circuit. The results of the Hilton et al. study indicate that the conductance properties of a thin film superconducting microbridge can be modified by ion milling. Contrary to the inventive method, the study was performed with ions impinging the surface at normal incidence, and contained no indication of surface smoothing. Significantly, it has now been determined that the roughness of a film surface of planar material can be substantially reduced, with excellent control of the thinning process, by using ion beams at grazing incidence angles.

Advantageously, the roughness of c-axis oriented superconducting $YBa_2Cu_3O_7$ layers due to the presence of crystallites of a/b-axis orientation can be reduced by thinning, in accordance with the inventive method. Presumably, this result derives primarily from anisotropic thinning rates correlated with the intrinsic anisotropies of atomically layered $YBa_2Cu_3O_7$. Thus, it is believed that the roughness due to mis-orientations in thin films of other planar superconductors will also be reduced by thinning according to the inventive method.

Significantly, control of the thinning process is facilitated by a substantially linear relationship between the thickness to resistivity ratio and the thinning time, typically observed after removal of mis-oriented phases. As a result of this linearity, a layer of a planar superconductor can be accurately thinned to a desired electrical thickness (or equivalently $d/\rho$ which has been defined as the sheet conductance) by using thinning time as a control parameter. The linear relationship between the thickness to resistivity ratio and the thinning time is exemplified by FIG. 2.

Though the inventive method can be practiced with a substrate temperature near room temperature during the thinning process, it may at times be advantageous to maintain the substrate at a low temperature during thinning. Low temperature processing typically decreases the possibility of defect diffusion in a superconductor film. Processing temperatures in the range between liquid helium temperature (4.2° K.) and liquid nitrogen temperature (77° K.), are currently believed to be most advantageous, since at these temperatures diffusion processes are substantially reduced.

Surprisingly, though the exposure of a planar superconducting thin film to an ion beam conventionally is expected to result in deteriorated crystal quality, thinning in accordance with the inventive method may even result in an improvement of the crystalline quality of the superconducting film. It is believed that the crystal quality of an as-deposited planar superconducting layer typically is relatively low due to the presence in the film of crystallites of more than one orientation. The crystallites having other than c-axis orientation are removed by the thinning process, leaving an ordered layer of substantially one orientation. Exemplarily, thinning removes the a-axis component from a $YBa_2Cu_3O_7$ thin film layer grown initially as c-axis oriented material. The resulting thinned film has c-axis orientation, and substantially lower $\chi_{min}$ than the as-deposited film.

Advantageously, thinning according to the inventive method results in thin smooth superconductive films that are robust to environmental changes. After processing, a thinned metal oxide superconductor, such as $YBa_2Cu_3O_7$, undergoes less deterioration than an as-deposited film upon exposure to normal atmospheric conditions. In addition, the $T_c$ of the superconductor layer of the final thickness typically is still relatively high, even after prolonged exposure to an ion beam, though frequently somewhat reduced from their values at the initial thickness.

After a film has been thinned to a desired thickness, the process of producing an article is completed by conventional techniques. These techniques may include photolithography, providing electrical contacts, and packaging. Exemplarily, in applications requiring very thin films, the final thickness is in the range of tens of angstroms where typically the initial thickness is in the thousands of angstroms, due to the general difficulty of depositing very thin, continuous films of high $T_c$ superconductors.

EXAMPLE 1

Two films of $YBa_2Cu_3O_7$ were deposited on the same (100) $SrTiO_3$ substrate, one film for electrical characterization and the other film for x-ray, SEM, and RBS characterizations. The films were 2400 Å thick c-axis oriented films made in a three-source evaporator. The films were thinned for a selected time and then measured for electrical, x-ray, SEM, and RBS characterizations. This procedure was repeated until the film thickness approached tens of angstroms. During each thinning process, the films were mounted on a substrate platform which was rotated at approximately 2 Hz and oriented at a 10 degree grazing angle of incidence with respect to the impinging ion beam. Xenon ions, extracted from a Kaufman ion source operating at a pressure of $1.5 \times 10^{-4}$ Torr, were used with an energy of 1000 eV and a current density of 150 $\mu A/cm^2$.

Figure 2:
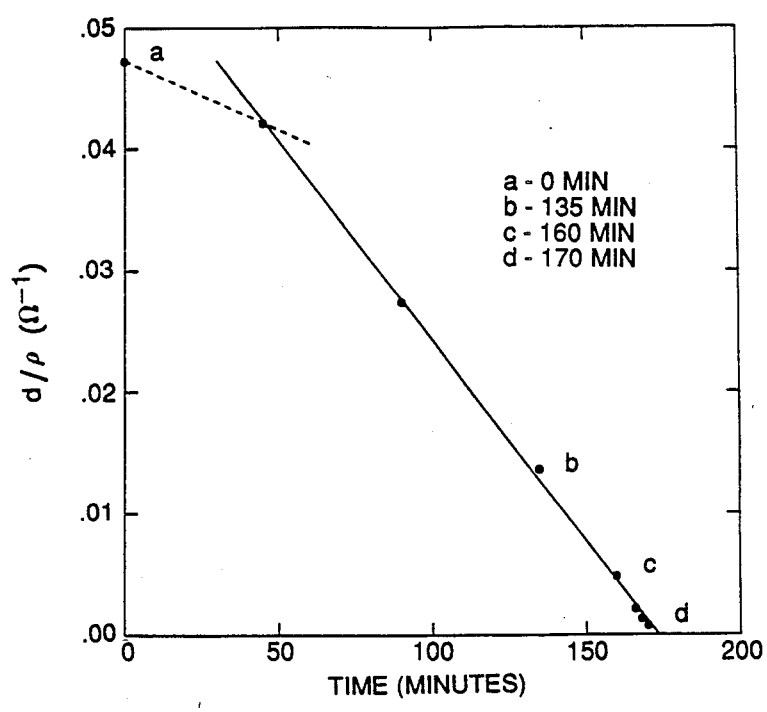
FIG. 2 is an exemplary plot of the room temperature sheet conductance, $d/\rho$, versus thinning time for a layer of $YBa_2Cu_3O_7$ on a $SrTiO_3$ substrate.

Electrical measurements were taken using the Van der Pauw technique with four equally-spaced indium contacts soldered at the boundary of the film. FIG. 2 is a plot of the room temperature sheet conductance $(d/\rho)$ versus thinning time. After 45 minutes of thinning, the trend in the data is linear (solid line in FIG. 2), hence indicating a uniform thinning rate. The final thickness of 40 Å after 170 min of thinning [(d) in FIG. 2] is approximately equal to the 2400 Å starting thickness multiplied by the ratio of the ordinate values for $d/\rho$ at (d) and (a).

Figure 3:
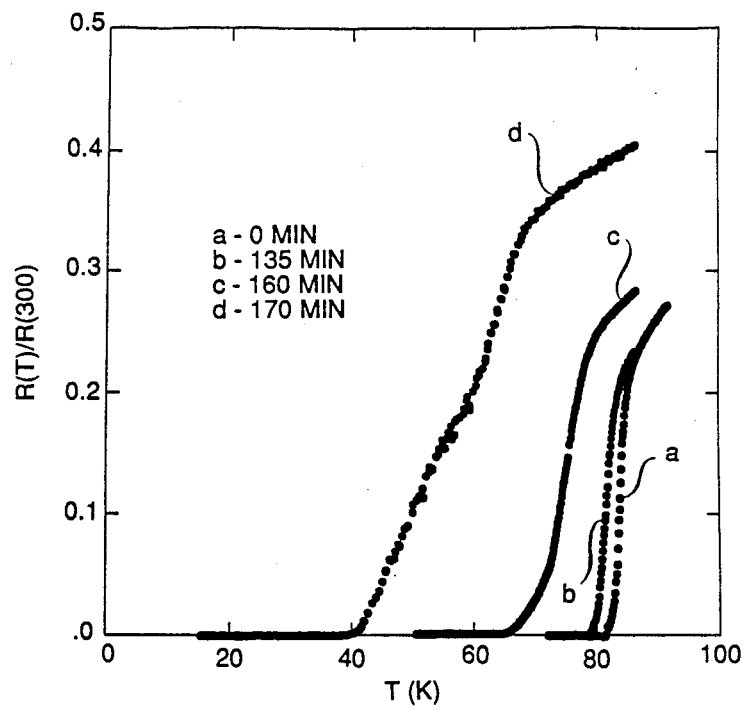
FIG. 3 shows an exemplary plot of resistance, normalized to the resistance at 300° K., corresponding to the points (a)-(d) in FIG. 2.

Initially, the film had a zero-resistance transition, $T_c$, of approximately 82° K. The metallic character of the film (i.e., a positive temperature coefficient of resistance) was preserved at all stages of thinning. FIG. 3 is an exemplary plot of the resistance, normalized to the resistance at 300° K., corresponding to the points (a)–(d) in FIG. 2. After thinning to an electrical thickness of 40 Å (corresponding to a mere three to four lattice constants), the film still showed a $T_c$ of about 40° K. At intermediate thicknesses the film had intermediate values of $T_c$.

RBS data using 2 MeV $He^+$ ions scattered at 170 degrees were also recorded after each thinning step. Significantly, $\chi_{min}$ decreased a factor of three from 34% for the initial film [(a) of FIGS. 2 and 3] to 11% for the film thinned for 135 min [(b) of FIGS. 2 and 3], indicating that the degree of film alignment has increased from 66% to 89%. This result demonstrates that as the films are thinned, the disordered and textured a-axis component is removed leaving an ordered substantially 100% c-axis phase with relatively low $\chi_{min}$.

EXAMPLE 2

Figure 4:
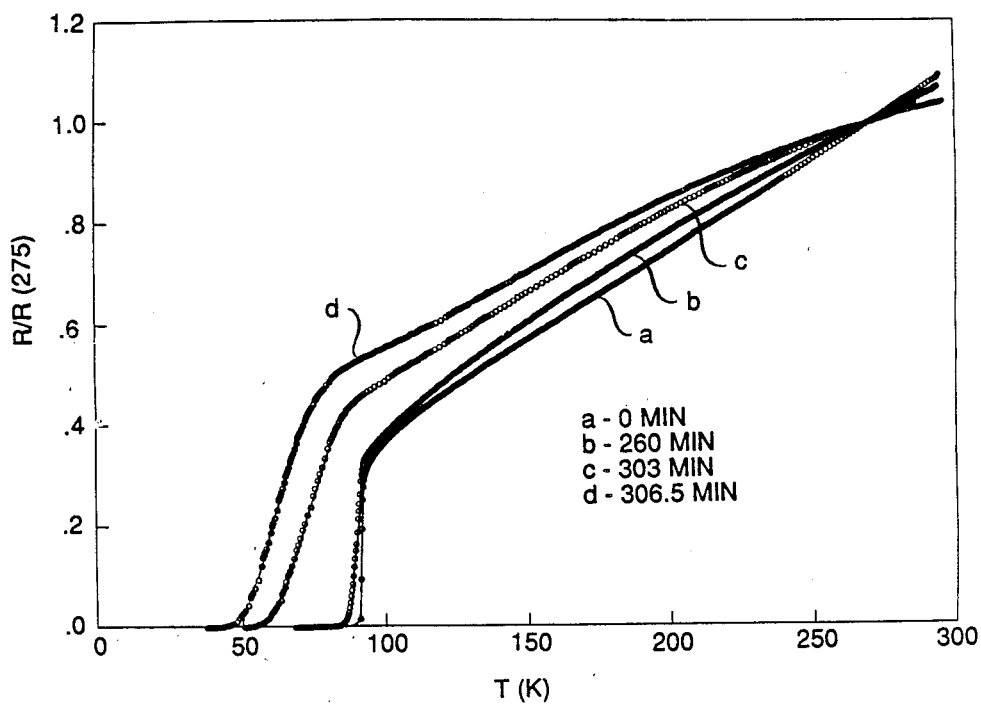
FIG. 4 shows an exemplary plot of the resistance, normalized to the resistance at 275° K., of an initially 4000 Å layer of $YBa_2Cu_3O_7$ on a $SrTiO_3$ substrate after ion thinning for various periods of time.

A 4000 Å thick film of $YBa_2Cu_3O_7$ on a (100) $SrTiO_3$ substrate was prepared, thinned, and characterized substantially as described in Example 1. FIG. 4 shows an exemplary plot of the resistance, normalized to the resistance at 275° K., after thinning of the film for various periods of time. Table 1 indicates the electrical thickness and thinning time associated with (a)–(d) in FIG. 4.

TABLE 1

|     | Electrical Thickness | Milling Time |
| --- | --- | --- |
| (a) | 4000Å | 0 min. |
| (b) | 746Å | 260 min. |
| (c) | 76Å | 303 min. |
| (d) | 37Å | 306.5 min. |

I claim:

1. Method of producing an article comprising a metal oxide superconductor having a planar crystal structure, the method comprising:
   (a) providing a substrate;
   (b) forming a layer of the metal oxide superconductor on the substrate; and
   (c) completing producing the article; CHARACTERIZED IN THAT (d) associated with the layer of step (b) is an initial electrical thickness D, and step (c) comprises thinning the layer, removing material from the layer by exposing the layer to an ion beam, such that at least a portion of the superconducting layer attains an electrical thickness d, with d<D; and (e) associated with the ion beam is an ion energy and a beam direction, the ion energy being in the range 50 eV to 1000 eV, and the beam direction forming an angle of incidence in the range 5° to 20° with the layer surface.

2. Method of claim 1, wherein the ion beam comprises ions of at least one element chosen from the group of elements consisting of $O_2$, Xe, Ar, He, Ne, and Kr.

3. Method of claim 1, wherein the metal oxide superconductor is $YBa_2Cu_3O_x$, with x about 7.

4. Method of claim 2, wherein the angle of incidence is in the range of 10°–15°.

5. Method of claim 1, wherein, during at least a part of step (c), the substrate is maintained at a temperature between liquid nitrogen temperature and liquid helium temperature.

6. Method of claim 1, wherein d is in the range 40–800 Å.

7. Method of claim 1, wherein the substrate is rotated during at least a portion of step (c), the substrate rotated at a rate in the range 0.1–20 Hz.

* * * * *